United States Patent
Lagrange et al.

(10) Patent No.: US 9,196,783 B2
(45) Date of Patent: Nov. 24, 2015

(54) METHOD FOR INSULATING NANOWIRES OR MIRCOWIRES

(71) Applicant: COMMISSARIAT A L'ENERGIE ATOMIQUE ET AUX ENE ALT, Paris (FR)

(72) Inventors: Alexandre Lagrange, Eybens (FR); Stephan Landis, Voiron (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 14/373,836

(22) PCT Filed: Jan. 23, 2013

(86) PCT No.: PCT/EP2013/051259
§ 371 (c)(1),
(2) Date: Jul. 22, 2014

(87) PCT Pub. No.: WO2013/110671
PCT Pub. Date: Aug. 1, 2013

(65) Prior Publication Data
US 2015/0008456 A1     Jan. 8, 2015

(30) Foreign Application Priority Data
Jan. 23, 2012   (FR) ..................... 12 50640

(51) Int. Cl.
*H01L 33/00* (2010.01)
*H01L 29/06* (2006.01)
(Continued)

(52) U.S. Cl.
CPC .............. *H01L 33/005* (2013.01); *B82Y 10/00* (2013.01); *H01L 27/156* (2013.01);
(Continued)

(58) Field of Classification Search
CPC ..... H01L 33/005; H01L 33/18; H01L 27/156; H01L 2933/0016; H01L 21/02603; H01L 29/0676; H01L 2924/0002; H01L 27/153; H01L 33/24; H01L 33/0079; H01L 33/08; H01L 2924/00; B82Y 40/00
USPC ............................................... 257/88; 438/34
See application file for complete search history.

(56) References Cited

U.S. PATENT DOCUMENTS 7,906,354 B1  3/2011  Ellinger et al.
8,535,962 B2  9/2013  Gilet et al.
(Continued)

FOREIGN PATENT DOCUMENTS

FR   2 902 237 A1   12/2007
FR   2 930 839 A1   11/2009
WO   WO 2009/135078 A2   11/2009

OTHER PUBLICATIONS

International Search Report issued May 8, 2013 in PCT/EP2013/051259.
(Continued)

*Primary Examiner* — Peter Bradford
(74) *Attorney, Agent, or Firm* — Oblon, McClelland, Maier & Neustadt, L.L.P.

(57) ABSTRACT

A method for producing a microelectronic device including a plurality of light emitting diodes each including a wire of nanometric or micrometric size, the method including: growing the nanowires from a growth substrate; forming at least one dielectric layer on a transfer substrate distinct from the growth substrate; and penetration by the nanowires in the dielectric layer.

27 Claims, 7 Drawing Sheets

(51) Int. Cl.
*H01L 33/18* (2010.01)
*H01L 33/24* (2010.01)
*B82Y 10/00* (2011.01)
*B82Y 40/00* (2011.01)
*H01L 21/02* (2006.01)
*H01L 27/15* (2006.01)
*H01L 33/08* (2010.01)

(52) U.S. Cl.
CPC ....... *H01L 29/0676* (2013.01); *H01L 33/0079* (2013.01); *H01L 33/18* (2013.01); *H01L 33/24* (2013.01); *B82Y 40/00* (2013.01); *H01L 21/02603* (2013.01); *H01L 27/153* (2013.01); *H01L 33/08* (2013.01); *H01L 2924/0002* (2013.01); *H01L 2933/0016* (2013.01)

(56) References Cited

U.S. PATENT DOCUMENTS

2006/0163199 A1\* 7/2006 Van Den Meerakker et al. .............................. 216/56
2007/0235738 A1\* 10/2007 Jin et al. ........................ 257/79
2010/0051986 A1 3/2010 Min et al.
2011/0036396 A1 2/2011 Jayaraman et al.

OTHER PUBLICATIONS

Shu-Chia Shiu, et al., "Transfer of aligned single crystal silicon nanowires to transparent substrates", Proceedings of SPIE, vol. 7047, XP055045512, Aug. 28, 2008, pp. 70470E-1 to 70470E-8.

Jing-Shun Huang, et al., "Well-aligned single-crystalline silicon nanowire hybrid solar cells on glass", Solar Energy Materials & Solar Cells, vol. 93, No. 5, XP026027448, May 1, 2009, pp. 621-624.

Zhiyong Fan, et al., "Wafer-scale assembly of highly ordered semiconductor nanowire arrays by contact printing", Nano Letters, vol. 8, No. 1, XP055017384, Jan. 1, 2008, pp. 20-25.

Harry D. Rowland, et al., "Impact of polymer film thickness and cavity size on polymer flow during embossing: toward process design rules for nanoimprint lithography", Journal of Micromechanics and Microengineering, vol. 15, 2005, pp. 2414-2425.

F. Lazzarino, et al., "Mold deformation in nanoimprint lithography", J. Vac. Sci. Technol. B, vol. 22, No. 6, 2004, pp. 3318-3322.

\* cited by examiner

Prior Art

View in cross section | Plan view

METHOD FOR INSULATING NANOWIRES OR MIRCOWIRES

TECHNICAL FIELD OF THE INVENTION

The present invention concerns light emitting diodes in general and more particularly those that are produced in the form of a multitude of wires of nanometric or micrometric sizes made from semiconductor materials.

PRIOR ART

The lighting industry, which is today largely based on the production of incandescent lamps characterised by high energy consumption for low light output, is orienting itself more and more towards the production of devices based on light emitting diodes, which have much better optical efficiency.

In particular, the new optical devices intended for lighting use light emitting diodes or LEDs. A particular type of LED is based on a multitude of wires made from semiconductor materials of nanometric sizes, normally referred to as "nanowires"

Figure 1:
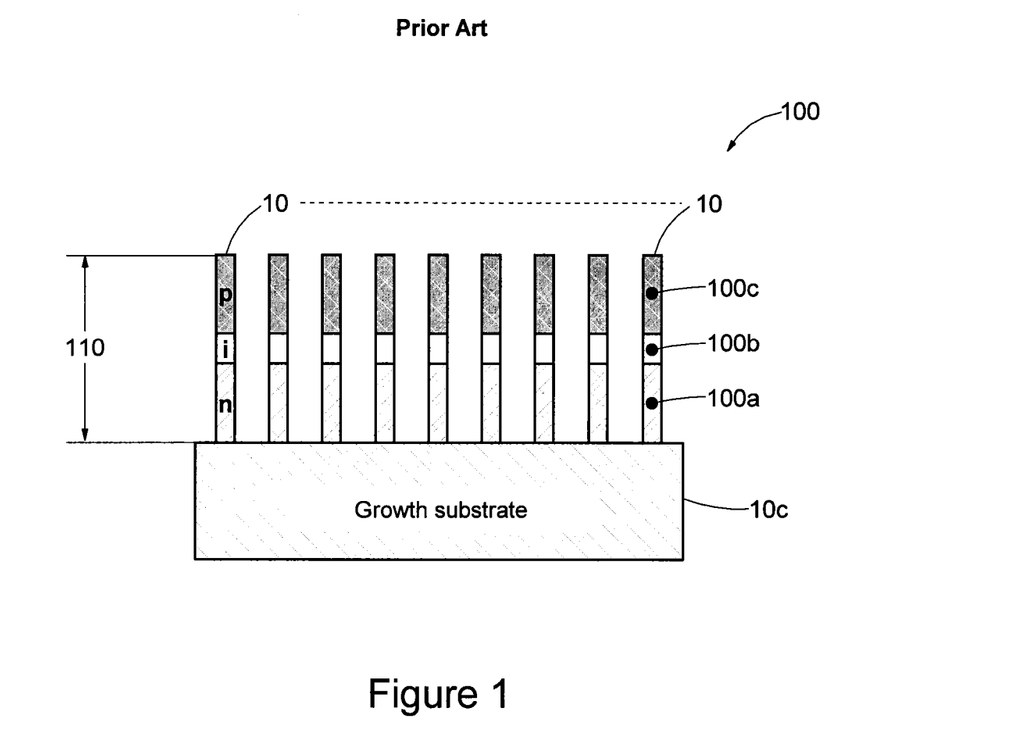
FIG. 1 is a view in cross section of a traditional nanowire or microwire structure, comprising a growth substrate and nanowires or microwires suitable for the production of light emitting diodes or LEDs, and serving as an imprint mould in the context of the method of the invention.

The structure of such an LED is shown schematically in FIG. 1. The nanowires are typically formed by epitaxial growth using a matrix of seeds disposed on the surface of a so-called growth substrate 10c.

Methods are widely described in the prior art. Reference can in particular be made to the document WO 2004/088755.

Each LED 10 then consists of a nanowire made from one or more semiconductor materials, the type and doping level of which can be varied during the growth. Usually it is sought to obtain a so-called PIN diode made from the same semiconductor material, characterised by a first part 100a, directly in contact with the growth substrate 10c, n-doped, that is to say by means of a suitable dopant of the semiconductor that makes it possible to develop a conduction mode by excess of electrons. A second intermediate part 100b, which is said to be intrinsic, that is to say not intentionally doped, gives rise to the production of light photons resulting from the recombination of the electrical carriers injected from the first part 100a and the third part 100c under the effect of the application of an electrical voltage intended to make a current flow in each of the nanowires. The third part 100c of each nanowire is p-doped, that is to say by means of an appropriate dopant of the semiconductor make it possible to develop a conduction mode through a deficiency of electrons.

The nanowires are typically formed by epitaxial growth, from the substrate 10c, of binary composite semiconductor materials, referred to as III-V, such as for example gallium nitride (GaN), gallium phosphide (GaP) or gallium arsenide (GaAs), or II-VI, such as zinc oxide (ZnO).

Each nanowire can be considered to be a waveguide. Because of its almost cylindrical shape, its size and its refractive index greater than the ambient environment, the light is guided substantially parallel to the growth axis of the nanowires. The light thus arrives at the end of the nanowires at a small angle with respect to the axis thereof, that is to say an angle less than the limit angle of total reflection, which facilitates the emergence of the light.

The mass production of such nanometric LEDs comes up against various problems that relate, among other things, to the obtaining of optimum light efficiency of the devices produced while enabling the light emitted in all directions, from the intermediate part 100b of each LED, to be effectively reflected in a favored direction and not to contribute to the heating of the device, or only to a small extent. The application of a voltage to the terminals of each LED must also be able to be done uniformly over all the nanowires and requires the use of substrates and structures making it possible to obtain a low electrical resistance and therefore low electrical losses in order to supply them.

These problems, which have received considerable attention from the scientific community involved in the design and development of these devices, have seen significant progress being made that makes it possible to envisage mass production actually being able to be established. However, a crucial problem that has received much less attention relates to the fact that it must also be possible to easily produce perfect electrical insulation of each of the nanowires after growth in order to prevent any short-circuit between them, despite often nanometric distances separating them, and for the entire life of the device.

The known solutions make provision for surrounding each nanowire with a dielectric material. In practice, a low-viscosity liquid dielectric material is poured onto the nanowires so that it fills the spaces between the nanowires. In order to obtain good insulation of each nanowire, it is necessary for the dielectric material to fill all the spaces between the nanowires. The flow of dielectric material takes place by gravity. It has turned out that short-circuits appear because of poor filling of the spaces situated between the nanowires. The filling, interfered with by capillary forces that oppose the gravity flow of the dielectric material, is sometimes imperfect, which requires the use of various lightly viscous dielectric materials to limit the capillary forces. To ensure the success of the LED manufacturing process and a long life for the product, the dielectric material must then undergo a solidification step.

The known solutions for solidifying the dielectric material typically provide for a thermal crosslinking or crosslinking by application of ultraviolet radiation. In the context of the development of the present invention, it has been found that these crosslinking solutions give rise to high thermal and/or optical stresses that are detrimental to the thermal and/or optical budget of the whole of the structure. It has even been found that these stresses may degrade the performances of the structure.

The invention aims to propose a solution for ensuring good electrical insulation of the wires while making it possible to reduce the thermal and/or optical stresses suffered by the structure.

The other objects, features and advantages of the present invention will emerge from an examination of the following description and the accompanying drawings. Naturally other advantages may be incorporated.

SUMMARY OF THE INVENTION

One aspect of the invention relates to a method for producing a microelectronic device comprising a plurality of light emitting diodes each comprising a wire of nanometric or micrometric size, the method comprising a step of growing the wires from a growth substrate, a step of forming at least one dielectric layer on a transfer substrate separate from the growth substrate and a step of penetration of the wires in the dielectric layer.

Thus the method provides for the production of two distinct assemblies: a first assembly comprising the wires and the growth substrate and a second assembly comprising the dielectric layer surmounting the transfer substrate. The two assemblies are then interleaved in each other so that the wires are immersed in the dielectric layer. They are thus moulded or forcibly inserted in the dielectric layer.

All the spaces between the wires are thus filled with dielectric material from the dielectric layer. The wires are thus perfectly insulated.

This method also makes it possible to use less liquid materials than those that must necessarily be used with the known solutions in order to provide satisfactory insulation. By using less viscous materials, it is then possible to significantly reduce or even eliminate the thermal and/or optical stresses required by the known solutions in order to manage to crosslink the dielectric material. The thermal and/or optical budget of the whole of the structure is then better preserved, that is to say the ability of the structure not to alter under the effect of optical or thermal stresses (typically a temperature applied for a given time) is better preserved. It will then be possible to perform the following steps of the method with more freedom concerning the stresses imposed on the structure. Furthermore, the final performances of the structure will not be degraded because of the stresses applied during the crosslinking steps.

Apart from this advantage related to the preservation of the thermal and/or optical budget of the whole of the structure, the method according to the invention offers numerous other advantages. In particular, the invention reduces the mechanical stresses imposed on the LEDs during crosslinking. These mechanical stresses are often in fact all the stronger, the more liquid the dielectric material before crosslinking.

Furthermore, the method according to the invention reduces the risk of complete coating of the wires. In the known solutions, this risk of coating the wires makes it necessary to perform additional method steps in order to leave clear the ends of the wires in order to provide connection thereof with the electrodes. These additional steps make the method more complex and expensive. The invention also reduces the risk of creating gaps, that is to say the absence of covering of the wires at the wire/dielectric interface or at the wire/support/dielectric interface.

More generally, the method according to the invention improves the electrical insulation of the wires while broadening the choice of dielectric materials. This is because, whereas with the known solutions to choice of the dielectric materials that can be used is limited since only very liquid dielectric materials can be poured onto the wires, the invention makes it possible to use significantly more viscous materials. The maximum viscosity corresponds only to the limit of the mechanical strength of the wires when the wires are inserted in the dielectric material.

Optionally, the method according to the invention may comprise at least any one of the following optional steps and features.

Preferentially, the penetration step is performed so that the wires completely pass through the dielectric layer. This feature is particularly advantageous since it simplifies the insulation of the wires. This is because, in the known methods stated above, the liquid-phase or vapor-phase deposition of a dielectric layer around the wires creates the risk of complete coating or covering of the wires or of some wires. This undesired coating requires an additional step of clearing the ends of the wires in order to provide electrical contact. Furthermore, the invention affords better control of the homogeneity and thickness of the dielectric layer.

Preferably, the penetration step comprises the application, to either the growth substrate or the transfer substrate, of a pressing force applied in a direction substantially parallel to the longitudinal direction of the wires. The longitudinal direction of the wires means the direction in which the wires have a maximum dimension.

The pressing force has an amplitude such that the force exerted by at least some of wires on the dielectric layer is greater than the plastic limit of the dielectric layer.

Advantageously, the method comprises, prior to the step of forming the dielectric layer, a step of forming a first electrode at least on the transfer substrate, so that, after the step of forming the dielectric layer, the first electrode is disposed between the transfer substrate and the dielectric layer.

Typically, the first electrode is a layer of electrically conductive material or semiconductor material or a layer of resin.

According to an advantageous embodiment, the first electrode completely covers the dielectric layer. The advantage of this method is in particular being especially simple. Preferentially, the first electrode also covers the whole of the transfer substrate.

According to another advantageous embodiment, the first electrode partially covers the dielectric layer. Preferentially, the first electrode covers only part of the transfer substrate. Thus the first electrode can provide routing or an electrical function. Advantageously, it is thus possible to define groups of wires in order to adjust the light power and/or the color and/or the thermics of the light radiation emitted by the device. Redundancy of LEDs can also be provided in order to manage cases of failure of some of the LEDs.

Advantageously, during the penetration step, at least some of the wires come into contact with the first electrode. More precisely, at least some of the second part of the wires come into contact with the first electrode.

Advantageously, at least the first electrode has a certain ductility and adjusting the thickness thereof makes it possible to compensate for any difference in length of the wires.

According to a particular embodiment, between the first electrode and the transfer substrate, an additional layer is formed providing compensation for the variability of the length of the wires. Particularly advantageously, this compensation layer is separate from and independent of the first electrode. This compensation layer has the advantage of allowing the formation of a first thin electrode whatever the amplitude and variability in length of the wires. The thickness of this compensation layer is preferably greater than the maximum amplitude of the difference in length between wires. Thus all the wires, whatever their size, have an end situated in the compensation layer. This compensation layer is for example produced from resin. The electrical contact can then be achieved peripherally, that is to say at the peripheral envelope of the wires rather than at the end thereof. This embodiment is particularly advantageous if the length of the wires has high dispersion. In a particular embodiment, the additional layer is disposed in contact with the substrate.

According to an advantageous embodiment, the method for producing the second assembly, that is to say the assembly comprising the transfer substrate, comprises a step of forming a second electrode disposed on the dielectric layer.

In this embodiment, the first electrode, the dielectric layer and the second electrode are formed before the step of penetration of the wires in said layers. The invention provides a reliable method, ensuring penetration of the wires in the various layers, homogeneously and uniformly. Furthermore, the invention proposes a method that is simple, rapid, reliable and inexpensive.

If the material forming the electrode is an electrically conductive material or a semiconductor material, then it is advantageously deposited by vapor-phase deposition involving a chemical reaction or by a simple physical deposition, these techniques normally being designated by the acronyms CVD and PVD respectively, from the English "chemical vapor deposition" and "physical vapor deposition".

If the material forming the electrode is a resin, then it can be deposited by centrifugation.

Advantageously, the transfer substrate can be produced from a material taken from: silicon (Si), germanium (Ge), metals, glass and sapphire.

In the present invention, the substrates may be rigid or flexible, flat or non-flat.

Advantageously, the growth step is performed by epitaxy.

Advantageously, the growth step is performed so that each wire has:
- a first part made from semiconductor material having a first doping, said first part being in contact with the growth substrate;
- a second part made from intrinsic semiconductor material, said second part being disposed on said first part;
- a third part made from semiconductor material having a second doping.

According to a first embodiment, said third part is disposed on said second part. Thus the second part is situated between the first and second parts. This structure is said to be axial.

According to a second embodiment, said second part covers at least part of the flanks of the first part and said third part covers at least part of the flanks of the second part. Thus the second part encompasses at least part of the first part and said third part encompasses at least part of the first and second parts. This structure is referred to as core/shell.

In this embodiment, one end of the first part is encompassed by the second part and by the third part.

Preferentially, the sum of the thicknesses of the first electrode, the dielectric layer and the second electrode is less than or equal to a height of at least some of the wires. The height of the wires is defined by the sum of the heights of the first, second and third parts of the wires. The height is the dimension separating the base of the wire, that is to say the end thereof in contact with the growth substrate, from the free end thereof.

Preferentially, the dielectric layer is a layer of resin deposited by centrifugation or spin coating.

Advantageously, the dielectric layer has a thickness lying between the height of the wires and the distance separating the first part from the third part. The thickness of the dielectric layer is thus at least equal to the height of the third part of the wires. Preferably it is greater than the height of the second and third parts of the wires. Thus the insulation of the wires is effective while providing easy access to the end of the wires to make the connections.

For example, the dielectric layer has thickness of between 10 nm and 500 μm and preferably less than 100 μm and preferably greater than 100 nm.

The typical diameter of the wire is from a few tens to a few hundreds of nanometres, while the total height thereof is 10 nm to 100 μm.

Advantageously, the method comprises, after the penetration step, a step of detachment of the growth substrate during which the growth substrate is removed while leaving the wires at least partially inside the dielectric layer.

Alternatively, the growth substrate forms a thin layer of semiconductor material surmounting an insulating layer that itself surrounds a receiving substrate. Advantageously, the method then comprises, after the penetration step, a step of detaching the transfer substrate during which the transfer substrate is moved while leaving in place the dielectric layer inside which the wires are at least partially contained.

Advantageously, the stack of layers formed by the thin layer, the insulating layer and the receiving substrate forms a stack of the silicon on insulator type.

Preferably, during the detachment step, at least one removal force is applied, substantially parallel to the longitudinal direction of the wires.

According to an advantageous embodiment, the detachment step comprises an application, to either the growth substrate or the transfer substrate, a principal force applied in a direction substantially orthogonal to the longitudinal direction of the wires and comprises: either the application to the other one from the growth substrate or the transfer substrate, of another force applied in the same direction as that of the principal force and in a direction that is the reverse of that of the principal force, or the holding of the other one from the growth substrate or the transfer substrate.

Thus the detachment step comprises the application of a shearing force in a direction substantially perpendicular to a principal direction in which the wires extend, this force tending to separate the growth substrate from the assembly formed by the wires inserted in the dielectric layer.

Alternatively, the detachment step comprises an application, to one from the growth substrate or the transfer substrate, of a principal torsion torque about an axis substantially parallel to a longitudinal direction of the wires and comprises: either the application, to the other one from the growth substrate or the transfer substrate, of another torque applied about the same axis as that of the principal torque and in a direction opposite to that of the principal torque, or the holding of the other one from the growth substrate or the transfer substrate.

Thus the detachment step comprises a step of applying a torsion torque about an axis substantially parallel to the direction of maximum length of the plurality of wires, this torque tending to separate the growth substrate from the assembly formed by the wires inserted in the dielectric layer.

According to a particular embodiment, the detachment step comprises a step of applying ultrasonic waves or vibrations. The frequency of the ultrasonic waves or vibrations is chosen so as to be a resonant frequency of the plurality of wires.

The wires are nanowires or microwires. They have a length of less than 500 micrometres and preferably less than 100 μm.

According to another aspect, the invention describes a method for the electrical insulation of a plurality of wires of nanometric or micrometric size extending from a growth substrate so as to form a first assembly, the method being characterised in that it comprises:
- the preparation of a second assembly separate from the first assembly and forming a multilayer assembly, also referred to as a stack of layers, comprising a transfer substrate on which at least one dielectric layer is disposed;
- a step of penetration of the plurality of wires in the dielectric layer.

Advantageously, the wires are preserved in the dielectric layer at the end of the penetration step.

Advantageously, the first multilayer assembly is used as an imprint mould of the second multilayer assembly.

Advantageously, the wires extend in a direction substantially perpendicular to the surface of the growth substrate. Thus all the wires extend in a common direction. They thus form a forest of wires. An assembly formed by a growth layer or a growth substrate and surmounted by wires forms a multilayer assembly. Typically a forest of wires has a density of between 1E4, that is to say 10,000, and 1E11 per square centimetre. Typically, each wire has a circular cross section with a diameter of between 10 nm and 100 μm.

Optionally but particularly advantageously, a solidification of the dielectric layer is effected after the moulding step.

Optionally but particularly advantageously, the following are carried out: a detachment of the growth substrate from the forest of wires; partial removal from the mould of the second assembly in which the growth substrate is removed, and the plurality of wires are left in place.

Alternatively, at least part of the growth substrate is left in place and the transfer substrate is detached.

Advantageously, each wire forms a light emitting diode.

According to another aspect, the invention relates to a device obtained according to the previous method. The device is for example an optical device.

According to another aspect, the invention relates to a set of multilayer assemblies comprising at least a first multilayer assembly comprising a growth substrate and wires extending from the growth substrate, characterised in that it also comprises at least a second multilayer assembly distinct from the first multilayer assembly, the second multilayer assembly comprising a transfer substrate surmounted by at least one dielectric layer, the first and second multilayer assemblies being configured so that the interleaving thereof enables the wires to penetrate the dielectric layer.

More precisely, the first and second multilayer assemblies are configured so that the interleaving thereof enables to wires to penetrate the dielectric layer when the latter is not crosslinked or has a viscosity below the plastic deformation limit of the wires.

In the embodiment illustrated, Si wires have been transferred into a resin with a Young's modulus of $E=1^E6$ Pa, and a viscosity of $nu=1^E7$ Pa·s. The pressure applied is 15 bar.

In general terms, there is no minimum viscosity threshold for the dielectric layer in order to be able to apply the invention. The maximum viscosity threshold for its part depends on the elastic deformation limit of the wires. It is necessary for the pressure applied to the wires during moulding to overcome the viscosity of the dielectric to remain below the elastic deformation limit. Therefore this depends on the material of the wires (GaN, ZnO, etc) and their topology and typology (with resulting pressure on the wires).

Optionally, the set of multilayer assemblies according to the invention may comprise at least any one of the following optional features.

The length of at least some of the wires is greater than or equal to the thickness of the dielectric layer and the dielectric layer has a thickness lying between the distance separating the first and second parts and 100% of the height of the highest wires.

Thus the first and second multilayer assembles are configured so that pressing one multilayer assembly into the other multilayer assembly enables the wires to pass right through the dielectric layer.

Advantageously, the second multilayer assembly comprises a first electrode that at least partially covers the transfer substrate and is surmounted by the dielectric layer.

Advantageously, the second multilayer assembly comprises a second electrode at least partially covering the dielectric layer, so that the dielectric layer is disposed between the first and second electrodes.

According to an advantageous embodiment, the growth substrate is a multilayer assembly of the silicon on insulator (SOI) type.

Preferentially, each wire in the first multilayer assembly has:
a first part made from a semiconductor material having a first doping, said first part being in contact with the growth substrate;
a second part that corresponds to the active zone in which the e-/hole pair recombinations will take place. It may for example be formed from intrinsic semiconductor material, said second part being disposed on said first part;
a third part made from semiconductor material having a second doping, the second doping being opposed to the first doping, said third part being disposed on said second part.

Thus the second so-called active part is situated between the first and third parts.

Advantageously, the first and second multilayer assemblies are configured so that, when they are interleaved, the first electrode is in contact with at least some of the wires.

Preferably, the first and second multilayer assemblies are configured so that, when they are interleaved, the second electrode is in contact with at least some of the wires.

Advantageously, the dielectric layer is disposed in direct contact with the first electrode and the second electrode when they are present. In a particular embodiment, the first electrode is disposed in contact with the substrate or in contact with the additional compensation layer.

Preferentially, the third part of some of the wires at least and the first part at least are in contact with respectively the first electrode and the second electrode.

Advantageously, the dielectric layer is a layer of resin produced from polymer material. Advantageously, said polymer material is polyhydroxystyrene or of the methacrylate type.

In the context of the present invention, the diameter of the wires is less than the height. It is preferably necessary for the ratio of the diameter to the height to be less than $1/5$ or $1/10$, in order in particular to pierce the layer more easily. For example, the height of the wires is between 100 nm and 500 μm.

BRIEF DESCRIPTION OF THE FIGURES

The aims, objects, features and advantages of the invention will emerge more clearly from the detailed description of an embodiment of it that is illustrated by the following accompanying drawings, in which.

The accompanying drawings are given by way of examples and are not limitative of the invention.

DETAILED DESCRIPTION OF THE INVENTION

It is specified that, in the context of the present invention, the term "on" does not necessarily means "in contact with". Thus, for example, the deposition of a first layer on a second layer does not necessarily mean that the two layers are directly in contact with each other but means that the first layer at least partially covers the second layer while being either directly in contact therewith or being separated therefrom by another layer or another element.

In the remainder of the present description the term wire will be used to designate wires of nanometric or micrometric size. Typically, the length of the wires is less than 1 millimetre and preferably less than 500 micrometres and the diameter thereof is less than one fifth of the height thereof. Throughout the description, the term wires can therefore be read as nanowires or microwires.

As briefly described previously in the part on the prior art, and as illustrated in FIG. 1, it is necessary to be able to put a multitude of wires (nanowires or microwires) electrically in parallel, each constituting an independent LED, while providing as good as possible an electrical connection with the ends of the first 100a and third 100c parts of each of the wires which respectively constitute cathode and anode of the LEDs. Typically, from one hundred thousand to ten million wire LEDs must thus be able to be connected and perfectly insulated from one another, and between cathodes and anodes, in order to prevent any short-circuit.

The insulation, which must be done after growth of the wires, currently makes it necessary to use a dielectric that must be available in liquid form. The dielectric is then deposited on the "forest" of wires so that it can completely penetrate by gravity all the underlying gaps between the wires.

The drawback of the traditional technique disclosed above is that, depending on the density of the wires, it then sometimes becomes impossible to make the dielectric penetrate completely, by gravity, in the gaps of nanometric sizes between wires since capillarity forces may then be predominant. If the dielectric that it is wished to use has an excessively great viscosity with respect to the density of the wires and the spacing thereof, the liquid does not or only slightly penetrates the forest of wires. Capillarity forces are predominant over gravity and prevent penetration. This greatly limits the field of dielectric materials that can be used, not only to those that have a liquid phase during use but in addition, among these, to those that have sufficient fluidity vis-à-vis the density of the forest of wires that it is necessary to be able to insulate electrically. Moreover the control of the wetting of the wires and/or of the filling of the gaps by the dielectric material has an impact on the conformity of the depositing and requires subsequent technological steps, such as for example chemical mechanical polishing (CMP).

The invention makes it possible to dispense with this constraint by preparing, on a transfer substrate, distinct from the growth substrate, a dielectric film of a material the physical and chemical properties of which will in particular be chosen according to the prime function thereof, which is to obtain the best possible insulation between wires.

Various options for implementing the method of the invention are presented in FIGS. 2a to 2d, which illustrate views in cross section of a multilayer assembly comprising a transfer substrate on which at least the dielectric layer intended to insulate the wires is present.

Figure 2A:
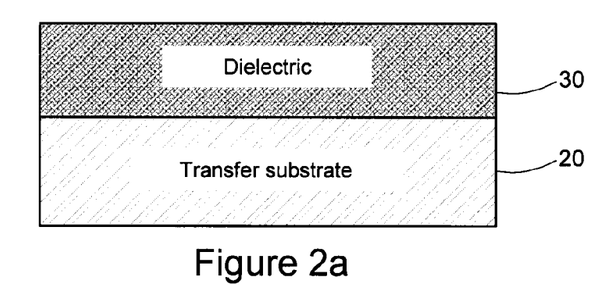
FIGS. 2a to 2d are views in cross section describing optional structures of a transfer substrate comprising at least one dielectric layer used for insulating nanowire or microwire LEDs.

In its simplest form, illustrated by FIG. 2a, the transfer substrate 20 has only a mechanical function of supporting the dielectric layer 30 that will subsequently be used, as will be seen below with the description of the method of the invention, for insulating the wires that have moreover been grown on a growth substrate.

According to the particular embodiment of the invention, the transfer substrate 20 may be made from very diverse materials including: silicon (Si), germanium (Ge) metals or glass and sapphire.

The dielectric layer 30 is deposited in a conventional fashion by centrifugation or spin coating if it is a case of a resin. Typically the resin used is then a polymer material that is composed of chains of the polyhydroxystyrene (PNS) type or of the methacrylate type, that is to say resins of the polymethyl methacrylate (PMMA) type. After deposition of the resin, stoving is carried out in order to evaporate the residual solvent present in the material so as to stabilise the thermal mechanical strength of the material.

Other means normally used by the microelectronics industry can be used for other dielectric materials, in particular those available in solid form, such as for example vapor depositions involving a chemical reaction or a simple physical deposition respectively designated by the acronyms CVD and PVD (chemical vapor deposition" and "physical vapor deposition".

Figure 2B:
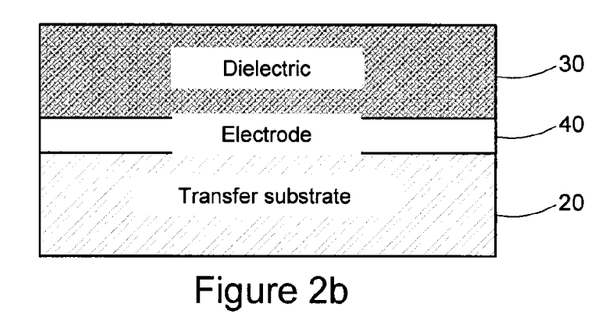

FIG. 2b illustrates a more elaborate alternative structure in which there is introduced between the transfer substrate 20 and the dielectric layer 30 a layer 40 intended to provide the electrical interconnection of the top parts of the wires forming the LEDs. These parts comprise the free end of the wires when they are on their growth substrate. They are referenced 100c in FIG. 1. The layer 40 is intended, as will be seen later, to form a first electrode, or head electrode, of the device based on wire LEDs. One function of the layer 40 forming the first electrode is to provide a homogeneous electrical distribution of the voltage applied to all the wires. It should therefore in general have a low electrical resistance. This property can be obtained in cooperation with the transfer substrate 20, which then serves as an electrical contact, if it remains in place in the end device.

The layer 40 can be using means already cited above: by centrifugation, CVD or PVD depending on the type of material employed, a non-exhaustive list of which will be found below with the description of FIG. 2. Typically, the thickness deposited lies in a range from a few nanometres ($10^{-9}$ meters) to several micrometers.

Optionally, the transfer substrate 20 can be removed in the end device using various known techniques: biochemical attack or chemical mechanical polishing (CMP) or by removal using a laser, a technique usually referred to as laser lift-off or LLO.

Figure 2C:
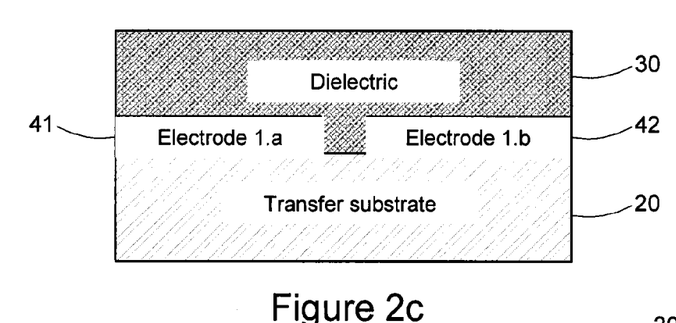

FIG. 2c illustrates a case where the transfer substrate 20 is a functional substrate that already includes electronic functions necessary for the functioning of the wire LEDs. By controlling the alignment of the electronic functions on the wires it is then possible to create groups of independent nanometric LEDs for the purpose for example of adjusting the light power of the devices, its color or the thermal behavior of the end component or to manage the redundancy of the LEDs in the event of failure of some of them. The electrode 40 is then divided into as many electrically independent zones as necessary, such as for example 41 and 42, in order to delimit components or parts of components and bunches of wires.

Figure 2D:
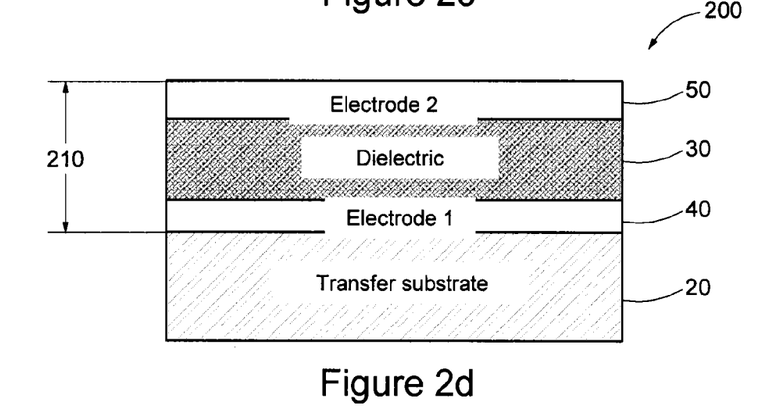

FIG. 2d illustrates an additional optional embodiment in which there is introduced, into the multilayer assembly comprising the transfer substrate, a second layer 50 intended for the electrical interconnection of the lower parts of the wires forming the LEDs, that is to say those extending from the growth substrate. These lower parts are referenced 100a in FIG. 1. This layer 50 is intended, as will be seen below, to form a second electrode 50, or base electrode, of the device based on wire LEDs. As with the first layer 40, one function of the layer 50 forming the second electrode is to provide a homogeneous electrical distribution of the voltage applied to all the wires and therefore to have low electrical resistance.

The materials used for the first and second interconnection layers, deposited with the means mentioned previously, are for example: metals normally used for manufacturing light emitting diodes, such as silver (Ag), platinum (Pt), palladium (Pd) or gold (Au); other materials normally used by the semiconductor industry such as nickel oxide (NiO) or a transparent electrically conductive material such as indium and tin oxide (ITO) or conductive polymers such as those used for LEDs made from organic materials (OLEDs).

Typically, the thickness deposited to form the layer 50 lies in a range from a few nanometres to a few tens of nanometres. It is important to note that the depositions of the layer 50 must be done without alteration of the underlying dielectric layer. In particular, if the dielectric material used is a resin, the deposition means employed for the layer 50 must not mean that the temperature exceeds the glass transition temperature (Tg) thereof so that the deposition takes place on a polymer material that is solid rather than in a viscous or even liquid state. To do this, a deposition of the PVD type by cathodic sputtering will be preferred among the deposition means mentioned above.

The total thickness 210 of the dielectric layer and of the second and first layers intended for the electrical interconnection of the wires is adapted to the growth height 110 of these as shown in FIG. 1.

The multilayer assembly comprising the growth substrate 10c and the wires 10 is hereinafter referred to as the first multilayer assembly 100. This first multilayer assembly 100 may comprise no layer other than the growth substrate and the wires. The multilayer assembly comprising the transfer substrate 20 and at least the dielectric layer 30 with optionally the interconnection layers is hereinafter referred to as the second multilayer assembly. As will be seen below, in order to eliminate the capillarity forces that prevent an insufficiently fluid dielectric from filling the gaps between wires by gravity, the method of the invention provides for a mechanical pressure to be exerted on the first multilayer assembly comprising so as to make the wires 10 completely penetrate the dielectric layer 30, by piercing the second interconnection layer 50 if it is present, until it comes into contact with or at least partly penetrates the first interconnection layer 40. The total thickness 210 of the dielectric layer 30 with any interconnection layers 40, 50 added must therefore not be greater than the minimum height of the forest of wires.

FIGS. 3a to 3d describe the steps of the method of the invention, which uses the first multilayer assembly 100 comprising the growth substrate 10c and the wires 10 as an imprint mould. The invention is not limited to certain materials that make up this first multilayer assembly 100 nor to the way in which it was obtained separately from the second multilayer assembly described in FIGS. 2a to 2d and which serves as a moulded part.

Figure 3A:
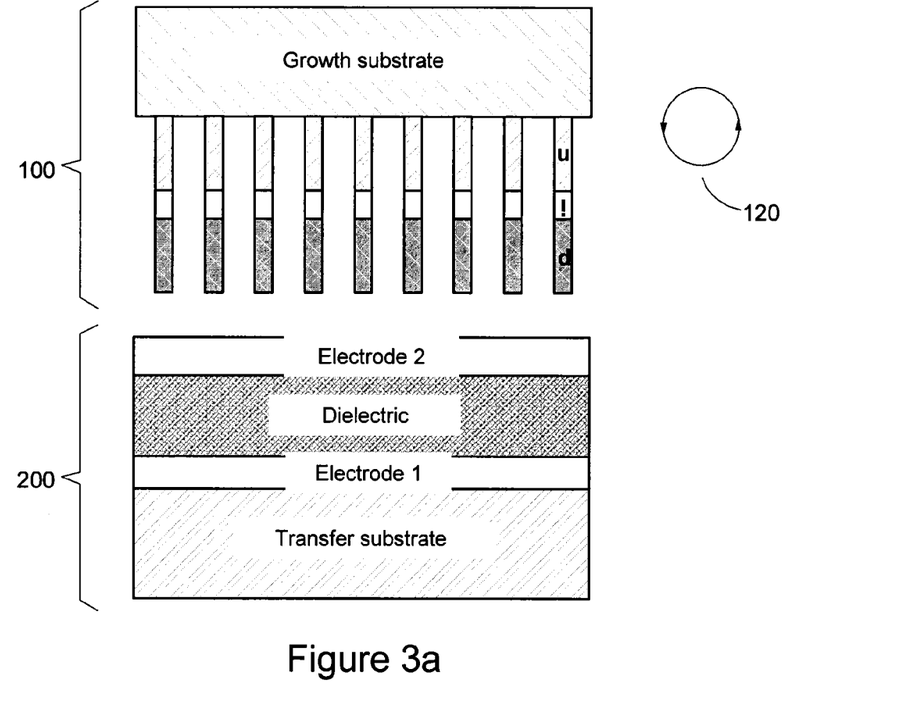
FIGS. 3a to 3d describe the steps of the method of the invention, which uses the imprint mould comprising the wires in order to insulate them by impressing them in the dielectric layer of the transfer substrate.

FIG. 3a illustrates the step where the two multilayer assemblies 100 and 200, which were prepared separately, will be assembled. As illustrated in the figures, the wires extend from the growth substrate 100 in a direction substantially perpendicular to the growth substrate 100. The multilayer assembly 100 comprising the growth substrate is turned over 120 so as to be used as a mould vis-à-vis the multilayer assembly 200 comprising the dielectric layer.

Figure 3B:
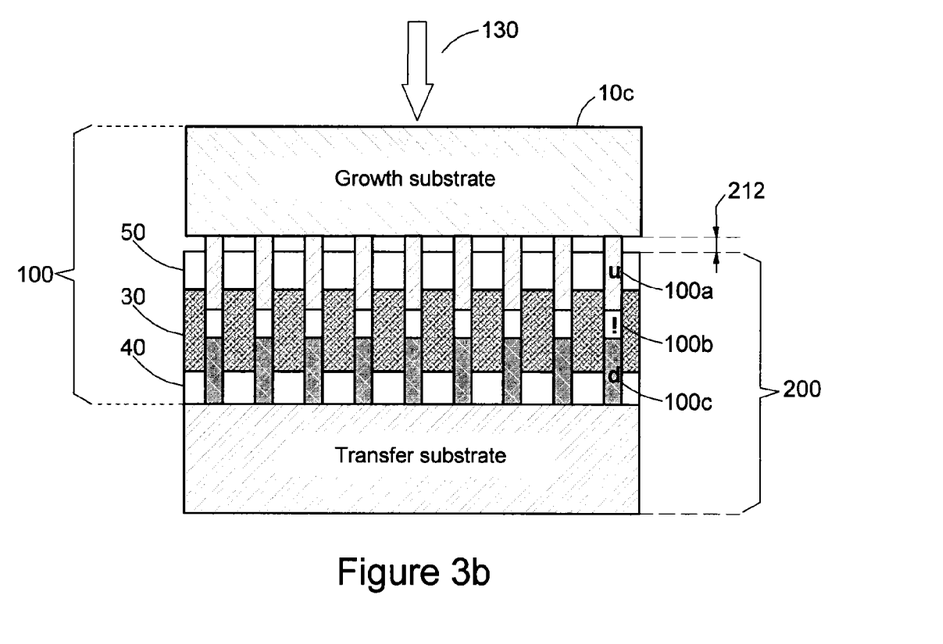

FIG. 3b shows the result of the moulding step during which the multilayer assembly 100, used as an imprint mould, has been penetrated by applying a mechanical pressure 130 thereto so that it passes through, in the example in FIG. 3b where the two interconnection layers are present, in the following order: the second layer 50 intended for the electrical interconnection of the wires and the dielectric 30 until it comes into contact with or at least partially penetrates the first interconnection layer 40 in order to ensure good electrical contact therewith. As seen above, the interconnection layers 40 and 50 are optional and only the dielectric layer 30 may be present.

The application of an external force 130, for example by means of a press, makes it possible to plant the wires in the dielectric layer. The application of this external force allows the use of a greater range of insulating materials, in particular materials that have very high viscosities. The filling of the forest of wires with a dielectric, which is liquid or viscous before stabilisation thereof, is then no longer solely governed by gravity and the capillarity forces which, as already seen previously, may be preponderant and prevent flow thereof into the submicron cavities forming the interstitial spaces between the wires. In the method according to the invention it is the pressure exerted on the multilayer assembly 100, comprising the wire transfer substrate, used as a nanoimprint mould, which becomes predominant, making it possible to completely fill the interstitial space between the wires. Cumulatively or alternatively, it should be noted that a pressure force may be applied to the second multilayer assembly.

As mentioned previously, the total thickness 210 of the dielectric and connection layers, if the latter are present, of the multilayer assembly 200 is adapted to the growth height 110 of the wires. Advantageously, the total thickness 210 will be adapted so as to provide a free space 212 at the foot of the wires in order to facilitate removal of the growth substrate 10c mechanically, chemically or by a combination of the two, as described below. Optionally, according to the particular embodiments of the invention and the materials used, this space 212 may not be necessary, or even prove to be a drawback, and may be non-existent (returned to zero), in which case the mould 100 will be penetrated until the growth substrate comes into contact with the top layer of the multilayer assembly 200, that is to say the second interconnection layer 50, if it is present as shown in FIG. 3b, or with the dielectric layer 30 itself.

Moreover, it should be noted that the individual thicknesses of the dielectric layer 30 and of the interconnection layers 40 and 50 are chosen so that the intermediate part or second part of the wires 100b, made from an intrinsic semiconductor material, are always entirely contained in the dielectric layer over the whole of the forest of wires of the device. Moreover, the choice of the thicknesses of the dielectric layer 30 and of the interconnection layers 40 and 50 is done so that the latter two can be in contact, exclusively and completely, only with respectively the third 100c and first 100a parts of the wires and without anywhere in the forest of wires it being able to be otherwise in order to prevent any faulty functioning of the wire LEDs.

Figure 3C:
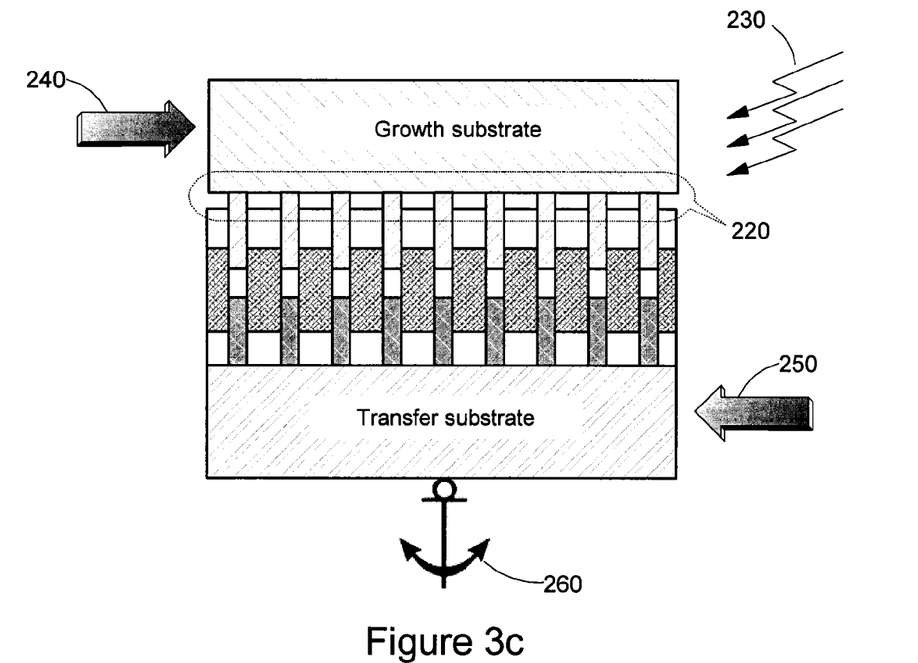

FIG. 3c illustrates the operation of mechanical detachment of the growth substrate. The detachment takes place from the rupture zone 220 where the free space 212 mentioned above has preferably been provided. The feet of the wires in the rupture zone are weakened by applying various types of mechanical stresses, for example by applying a pressure force or a lateral impact 240 to the growth substrate while the transfer substrate is immobilised 260. Opposing pressure forces or impacts 250 may also be applied simultaneously to the transfer substrate 20.

To facilitate the detachment, ultrasound 230 may be generated in a frequency range that will put the feet of the wires in resonance. All the above means can be employed conjointly, or alone or in combination successively. According to the particular applications of the method of the invention, only one of these means may suffice to provide the detachment of the growth substrate.

Advantageously, the above detachment operation takes place after the dielectric layer 30 has been partially or completely solidified or hardened at the end of the above moulding operation and therefore before applying the mechanical stresses described above. The means used for the total or partial solidification of the dielectric layer depend essentially on the materials used. In the case of the use of a dielectric resin, this may be crosslinked, that is to say stabilised thermally or by exposure to a radiation in the ultraviolet (UV) range of controlled duration (flash) in order to obtain hardening thereof.

Figure 3D:
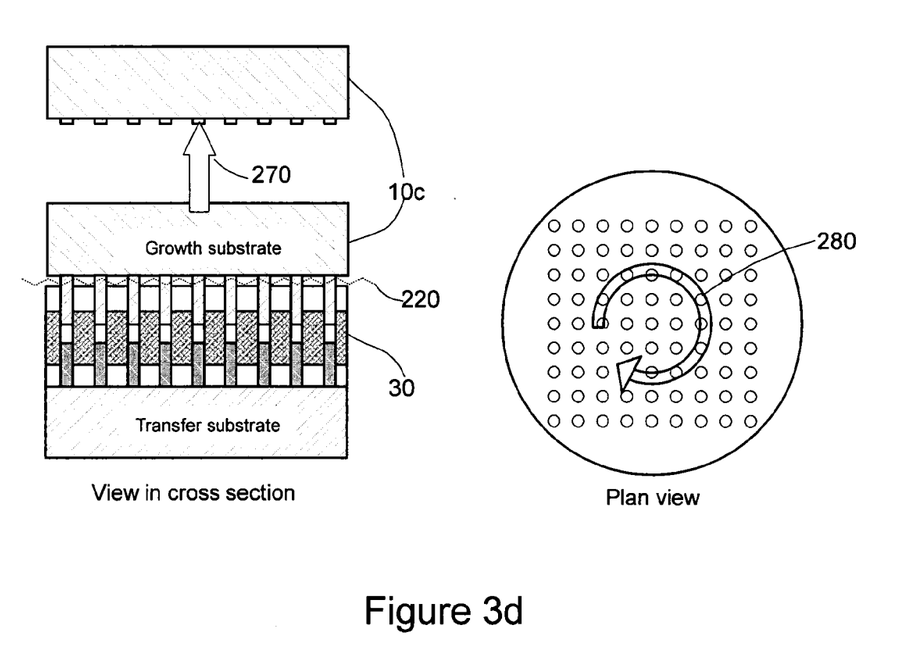

FIG. 3d illustrates the operation of partial removal from the mould, during which the mould, the growth substrate is separated from the second multilayer assembly inside which the wires have been inserted. A partial removal from the mould consists of removing the growth substrate 10c alone and leaving in place the wires that have become captive in the dielectric layer 30. As with the detachment, various mechanical stresses may be applied in order to obtain this result. A traction force 270 parallel to the longitudinal direction of the wires (that is to say generally perpendicular to the plane of the device) may be applied, which will make it possible to separate the assembly from the two multilayer assemblies at the rupture zone 220. A rotary movement 280 may also be applied simultaneously in order to obtain separation. For removal from the mould, numerous techniques can be applied, in particular those referred to as by peeling or parallel removal from the mould.

It should be noted that the method described in FIGS. 3a to 3d applies in general terms to any type of flat rigid substrate but also possibly to flexible and non-flat supports.

It should also be noted that the transfer substrate may be preserved. Alternatively, it may be eliminated in whole or in part. According to this alternative, the transfer substrate then fulfils an essential mechanical role such as a manipulation handle.

It should also be noted that, in the case of the use of a thermoplastic resin as a dielectric, this material has a reversible thermal behavior. It is then advantageous not to implement the imprint method at excessively high temperatures compared with the glass transition temperature (Tg) of the resin. This is because the metal layers and the organic materials have very different thermal expansion coefficients, typically different by an order of magnitude (×10). If excessively high temperatures with respect to the Tg are applied, the mechanical stresses generated at the polymer/metal interfaces cause a rupture of the metal film, which is obviously prejudicial to the correct functioning of the end device. Consequently it is advantageous to imprint the second multilayer assembly 200 at a temperature equal to or less than the glass transition temperature of the polymer. The force applied will be adjusted so that the stress generated by the films at the layers is sufficient to cause plastic (rather than elastic) deformation of the multilayer assembly. To do this, the mechanical properties of the dielectric layer 30 and of any second interconnection layer 50 will be used to evaluate the minimum mechanical stress to be applied. Advantageously, if the stress applied by a wire is greater than the higher plastic limit between that of the second interconnection layer and the dielectric material, it is possible to generate permanent deformation in the layers and therefore perforation thereof. This rule makes it possible, according to the wire density, to know the pressure that it is necessary to apply to the rear face of the mould.

Figure 4:
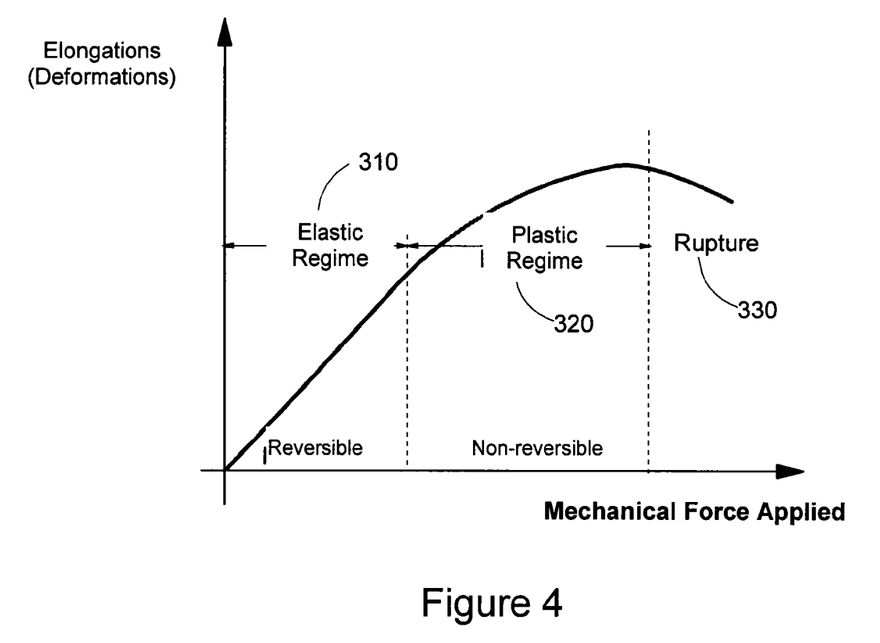
FIG. 4 illustrates the general behavior of a material subjected to a mechanical stress.

FIG. 4 illustrates the general behavior of the material subjected to a mechanical stress and shows the various zones where the deformations are successively reversible or elastic 310, plastic and non-reversible 320, before finally reaching a rupture point 330.

Moreover, it should be noted that, if an organic material that is no longer thermoplastic but which is photopolymerisable by means of an exposure that is controlled for time and intensity to ultraviolet radiations (flash UV), or thermosetting by means of a stoving step, is used as a dielectric, two approaches are possible:

the deposition of the second interconnection layer 50 is done after photopolymerisation or thermocrosslinking of the dielectric material. This step of stabilisation and hardening may be total or partial so that the deposition of the layer 50 is actually possible and a continuous layer with controlled roughness and without surface cracking is indeed obtained. The advantage of having partial stabilisation is to use a material that will be less rigid and therefore more easily deformable for the imprint step (moulding). The final stabilisation can be done after imprinting by means of a flash UV or after additional heat treatment;

the dielectric material is used without performing the stabilisation step, even partial, described above. The material may then be either liquid or very viscous. It will be ensured that the deposition of the second interconnection layer 50 may nevertheless be performed without drawback. If such is not the case, a step of prestabilisation of the dielectric layer is then performed. Prestabilisation is a step for obtaining a dielectric material in an intermediate state, for example semicrosslinked. For this purpose, heating is carried out at a lower crosslinking temperature and/or for a shorter period for that necessary for completely crosslinking the material. Such a step makes it possible not to damage the thermal budget of the structure. It is a case of a step for putting the material in an intermediate state to facilitate manipulation thereof for example, or to adapt the mechanical properties thereof to the imprint process. Prestabilisation may be carried out in the absence of the wires. If the use of the dielectric layer is actually possible without stabilisation, then hardening thereof is done during the imprint (moulding) phase and before separation of the wires from the growth support in order to obtain mechanical stability of the resulting multilayer assembly. There are thus two stabilisation phases:

a prestabilisation phase that serves to put the material in an intermediate state enabling it to be manipulated and/or enabling supplementary layers to be deposited. For example, material in a liquid form is deposited and this liquid is stiffened so that it no longer flows when the substrate is turned over or in order to be able to deposit a metal layer on top;

a final stabilisation phase for putting the material in its definitive state, compatible with the functioning and long life of the device.

Figure 5:
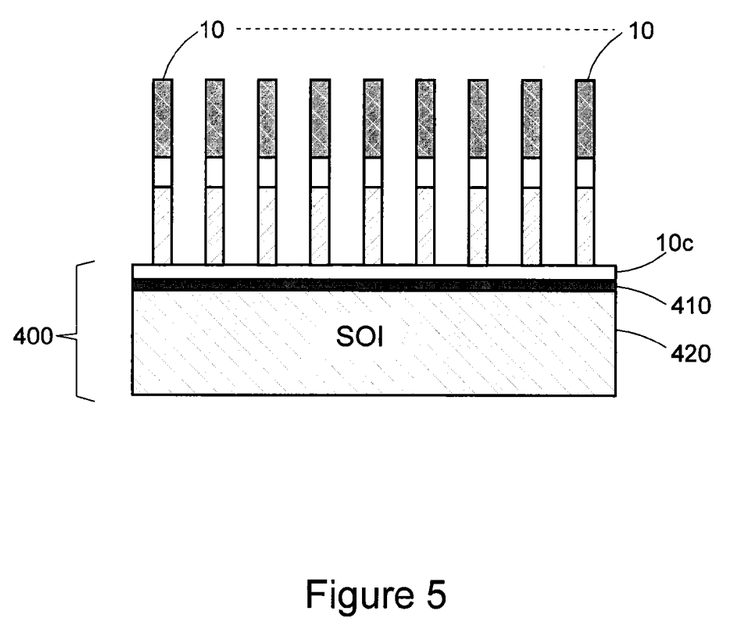
FIG. 5 describes an optional embodiment of the invention in which the growth substrate is replaced by an elaborate substrate of the silicon on insulator (SOI) type.

FIG. 5 describes an optional but advantageous embodiment of the invention in which the growth substrate 10c of the first multilayer assembly 100 is an elaborate substrate of the SOI (silicon on insulator) type. A term that covers an entire range of multilayer substrates produced by the microelectronics industry that make it possible to produce, in a thin surface layer of a semiconductor material, on an electrically insulating layer 410, high-performance electronic circuits. The surface layer 10*d* of the semiconductor and the insulation there 410 are themselves supported by a receiving substrate 420 generally made from silicon, which gives the whole sufficient mechanical rigidity to be manipulatable. It is the surface layer 10*d* that is in this case the layer from which the layers 10 are grown as described previously.

The advantage of using an SOI substrate is that it is known that this type of SOI substrate can be removed after transfer onto a transfer substrate.

Various techniques known to persons skilled in the art may be employed, which combine a mechanical, chemical or mechanical and chemical attacks (CMP) that will make it possible to leave in place only the growth layer 10*c*, which it will optionally be possible to keep or to cause to disappear according to the specificity of the device to be manufactured. For example, the layer 10*c* may be initially sufficiently conductive, or made conductive subsequently, to fulfil the role of the second layer 50, described in particular in FIG. 2*d*, and intended for the electrical interconnection of the lower parts of the wires forming the LEDs.

Provision can thus be made for performing a step of detaching the insulating layer 410 and the receiving substrate 420, this detachment step leaving the thin layer in place on the wires.

According to an alternative embodiment, the thin layer as well as the insulating layer 420 and the transfer substrate 410 are detached.

Thus the use of an elaborate substrate of the SOI type and techniques of removing the substrate mentioned above make it possible to replace the steps of detachment and partial removal from the mould of the growth substrate described in FIGS. 3*c* and 3*d* and not to have to use the corresponding mechanical stress means.

According to yet another embodiment, the whole of the first metal layer assembly is left in place. The thin layer as well as the insulating layer 420 and the transfer substrate 410 thus remain fixed to the wires. The transfer substrate 20 is for its part detached so as to leave in place the dielectric layer 30 inside which the wires are inserted. If the second multilayer assembly comprises one or more layers forming the electrodes 40, 50, then these layers are also maintained in place and in contact with the wires after detachment of the transfer substrate 20.

According to yet another embodiment, the layers 20, 410, 420 can be thinned without being completely eliminated.

Figure 6:
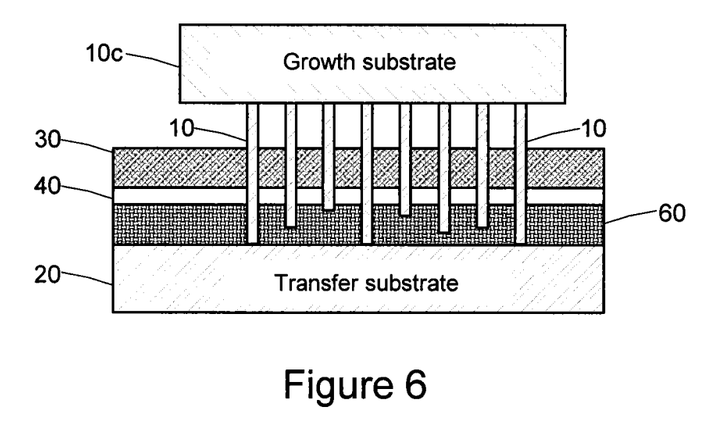
FIG. 6 describes a particular embodiment in which an additional compensation layer is introduced in order to take account of the variability in the length of the wires.

FIG. 6 illustrates a particular embodiment in which an additional layer is formed between the first electrode 40 and the transfer substrate 20. This additional layer, referred to as the compensation layer 60, provides compensation for the variability in length of the wires. The thickness thereof is preferably greater than the maximum of the difference in height in the lengths of the wires 10. Under these conditions the wires are made to penetrate until the shortest at a minimum come into contact with the first electrode 40, all the others passing through it and more or less sinking in the compensation layer 60. The electrical contact between the wires in the first electrode 40 therefore takes place correctly. The compensation layer 60 is thus conformed so as to absorb the difference in height of the wires. This contact is therefore done essentially at the periphery of the wires rather than at the end thereof. The compensation layer 60 is for example produced from resin. Particularly advantageously, this embodiment thus makes it possible to offer a method that is simple to implement and reliable, whatever the variability in the length of the wires.

Figure 7:
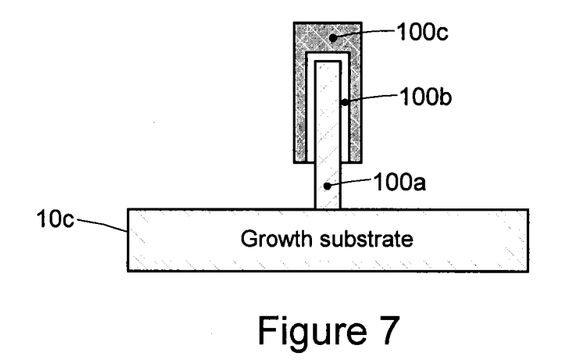
FIG. 7 illustrates a second embodiment of the wires of the "core-shell" type.

FIG. 7 illustrates a second embodiment of the wires in which the second part 100*b* of the wires covers at least part of the flanks of the first part 100*a*. The third part 100*c* in its turn covers at least part of the flanks of the second part 100*b* in order to form a wire structure referred to as "core-shell", whereas the structure describe previously is said to be "axial".

Figure 8:
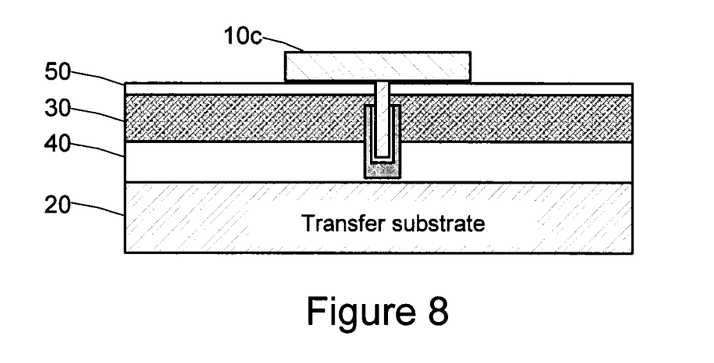
FIG. 8 shows the interleaving of the structure of wires of the core-shell type in the assembly formed on the transfer substrate.

In this embodiment, one end of the first part 100*a* is encompassed by the second part 100*b* and by the third part 100*c*. The interleaving of a first assembly according to this structure in the second assembly is illustrated in FIG. 8.

In general terms, an LED is composed of an n-doped part, a p-doped part and optionally a so-called active region situated between the n-doped part and the p-doped part (p-n diode or PIN diode). It is in this active region that the electron/hole recombinations take place. Such an active region may consist of quantal or double heterojunction wells or a region that is not intentionally doped. The active layer is a layer the gap energy of which is lower than that of the adjacent, namely p and n, layers. If it is a PIN diode, then there is a double heterojunction, if it is quantal wells then the material forming the well is the same as that used for the intrinsic layer, but in general it is surrounded by barrier layers, normally referred to as cladding layers, the gap energy of which is greater than that of the intrinsic layer and less than that of the n and p layers.

Figure 9:
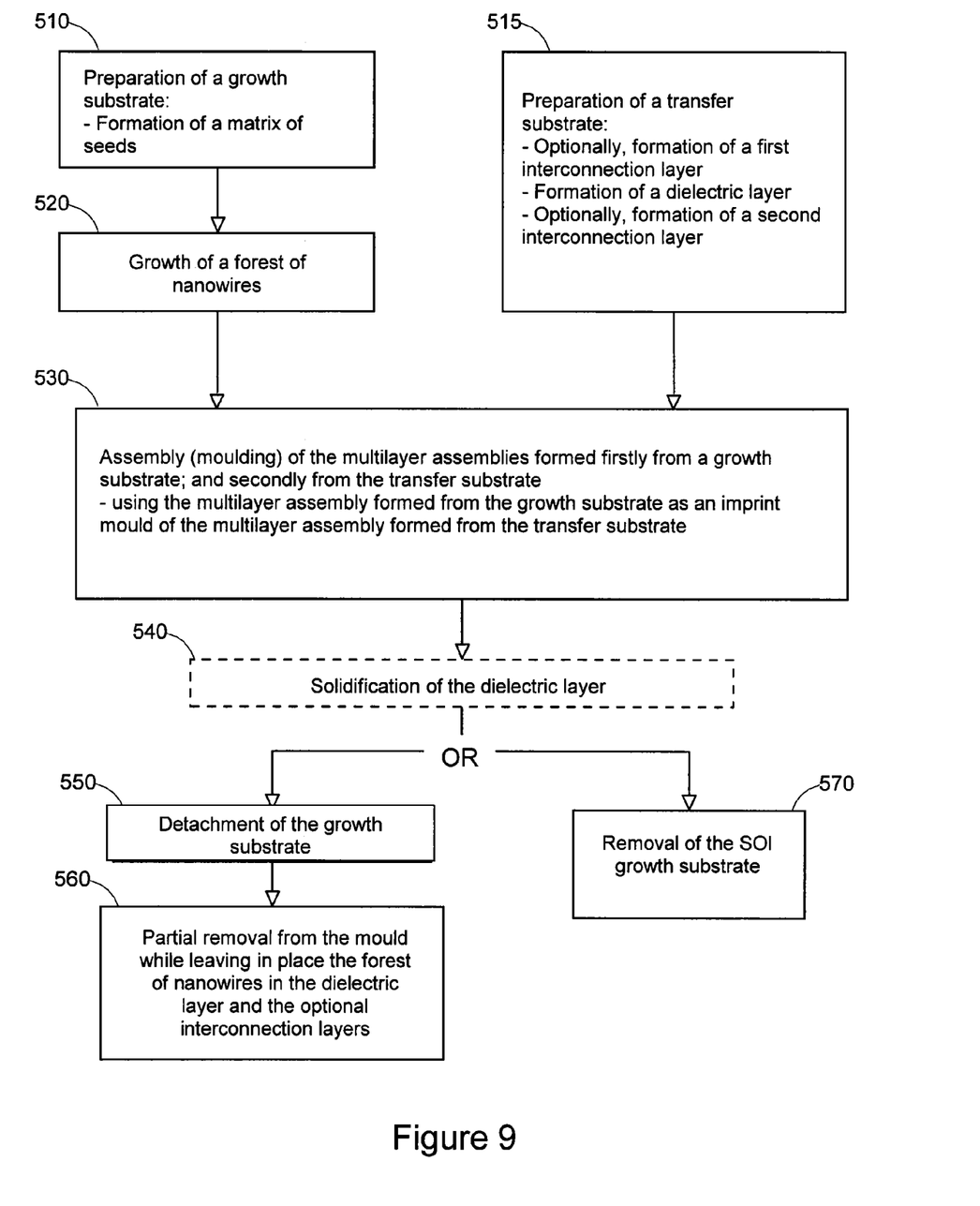
FIG. 9 summarises the steps of the method of the invention.

FIG. 9 summarises the steps of the method of the invention that affords insulation of the forest of wires. The method of the invention provides for the preparation of two distinct multilayer assemblies. Firstly the one containing the forest of wires which, for example, will make it possible to obtain as many LEDs as wires, from a growth substrate on which a matrix of growth seeds will initially have been formed 510. Of nanometric size, the seeds are preferentially obtained from the auto-organisation, in the form of a matrix of pins, of a material that will allow the growth of the wires made generally, as seen, from semiconductor materials. Optionally, the growth seeds may also be defined by conventional photolithography operations. The growth 520 of the wires and doping thereof occurs at the following step.

A second multilayer assembly is moreover prepared 515 from a transfer substrate 20 on which at least one layer of a dielectric material 30 intended to provide the electrical insulation of the forest of wires will be deposited. Optionally, a first 40 and second 50 layer for interconnection of the wires is included on either side of the dielectric layer 30.

Optionally, the step 515 of forming the dielectric layer 30 on the transfer substrate 20 is performed simultaneously with the step 510 of growth of the wires.

At the following step 530, referred to as penetration or moulding, the two multilayer assemblies are assembled using the multilayer assembly formed from the growth substrate and containing the wires to be insulated as an imprint mould for the multilayer assembly formed from the transfer substrate. At this stage, as seen, sufficient pressure is applied to the mould for the forest of wires to completely penetrate the dielectric layer, having previously passed through the second optional interconnection layer if it is present, until they come into contact with the first optional interconnection layer, and/or penetrate it at least partially, if it is present.

At the end of this step, an optional step of solidification of the dielectric layer 540 occurs if the state of the dielectric material used so requires. In particular, this operation is necessary if the dielectric is a liquid or viscous resin, which will be solidified to fix it to the wires.

The following step 550 is referred to as detachment. It consists of weakening, for example using various mechanical means described in FIG. 3c, the feet of the wires with a view to removal from the mould, which occurs at the following step 560 and consists of removing the growth substrate in order to leave in place only the wires now captive in the dielectric layer and the optional interconnection layers.

As described in FIG. 5, steps 550 and 560 are optionally replaced by a step 570 of removing a substrate of the SOI type if this type of elaborate substrate was initially used as growth substrate at step 510.

Finally, although described through the particular example of the manufacture of wire light emitting diodes, the method according to the invention can be applied in general to the insulation of wires which, with their growth substrate, can be used as an imprint mould of a dielectric layer which will have been prepared on a separate transfer substrate in the context of the manufacture of any microelectronic and/or optical device. The method described is therefore in no limited to the production of wire LEDs, which have served only as a favored example to illustrate the implementation of the invention.

The invention claimed is:

1. A method for producing a microelectronic device including a plurality of light emitting diodes each including a wire of nanometric or micrometric size, the method comprising:
   growing the wires from a growth substrate;
   forming at least one first electrode covering a transfer substrate distinct from the growth substrate;
   forming at least one dielectric layer on the first electrode;
   forming at least one second electrode on the dielectric layer, so that the dielectric layer is disposed between the first electrode and the second electrode;
   penetrating the wires through the second electrode and at least a part of the dielectric layer.

2. The method according to claim 1, wherein the penetration is performed so that the wires pass completely through the dielectric layer.

3. The method according to claim 1, wherein the penetrating comprises application of one from among the growth substrate or the transfer substrate of a pressing force applied in a direction substantially parallel to a longitudinal direction of the wires.

4. The method according to claim 3, wherein the pressing force has an amplitude such that force exerted by at least some of the wires on the dielectric layer is greater than plastic limit of the dielectric layer.

5. The method according to claim 1, wherein the first electrode completely covers the dielectric layer.

6. The method according to claim 1, wherein the first electrode partially covers the dielectric layer.

7. The method according to claim 1, further comprising, prior to the forming the at least one first electrode, forming a compensation layer at least partially covering the substrate and a thickness of which is at least equal to a maximum difference in height between two wires.

8. The method according to claim 1, wherein sum of thicknesses of the first electrode, the dielectric layer, and the second electrode is less than or equal to a height of at least some of the wires.

9. The method according to claim 1, wherein the dielectric layer has a thickness of between 10 nanometres and 500 micrometres.

10. The method according to claim 1, further comprising, after the penetrating, detaching the growth substrate during which the growth substrate is removed while leaving the wires at least partially inside the dielectric layer.

11. The method according to claim 1, wherein the growth substrate forms a stack comprising a thin layer of a semiconductor material surmounting an insulation layer that itself surmounts a receiving substrate; the method further comprising, after the penetrating, detaching the transfer substrate during which the transfer substrate is removed while leaving in place the dielectric layer inside which the wires are at least partially contained.

12. The method according to claim 10, wherein the detaching comprises an application to either the growth substrate or the transfer substrate of a principal force applied in a direction substantially orthogonal to a longitudinal direction of the wires and comprises: either application to the other one of the growth substrate or the transfer substrate of another force applied in a same direction as that of the principal force and in a direction opposite to that of the principal force, or holding of the other one from the growth substrate or the transfer substrate.

13. The method according to claim 10, wherein the detaching comprises an application, to either the growth substrate or the transfer substrate, of a principal torsion torque about an axis substantially parallel to a longitudinal direction of the wires and comprises: either application to the other one from among the growth substrate or the transfer substrate, of another torque applied about a same axis as that of the principal torque and in a direction opposite to that of the principal torque, or holding of the other one from the growth substrate or the transfer substrate.

14. The method according to claim 10, wherein the detaching comprises applying ultrasonic waves or vibrations.

15. The method according to claim 11, wherein the forming the dielectric layer on the transfer substrate is performed simultaneously with the growing the wires.

16. The method according to claim 1, wherein the wires have a length of less than 500 micrometres.

17. The method according to claim 1, wherein the wires extend from the growth substrate and in a direction substantially perpendicular to the growth substrate.

18. A set of multilayer assemblies comprising:
   at least one first multilayer assembly comprising a growth substrate and wires extending from the growth substrate, the wires having a circular cross section with a diameter of less than 100µm;
   at least one second multilayer assembly distinct from the first multilayer assembly, the second multilayer assembly only comprising a transfer substrate surmounted successively by a first electrode, a dielectric layer, and a second electrode, so that the dielectric layer is disposed between the first and second electrodes,
   the first and second multilayer assemblies being configured so that interleaving thereof enables the wires to penetrate the dielectric layer.

19. The set according to claim 18, wherein the first and second multilayer assemblies are configured so that, when they are interleaved, the first electrode is in contact with at least some of the wires.

20. The set according to claim 19, further comprising a compensation layer disposed between the first electrode and the transfer substrate.

21. The set according to claim 20, wherein a thickness of the compensation layer is at least equal to a maximum difference in height between two wires.

22. The set according to claim 18, which the first and second multilayer assemblies are configured so that, when they are interleaved, the second electrode is in contact with at least some of the wires.

23. The set according to claim 18, wherein the growth substrate is a multilayer assembly of silicon on insulator (SOI) type.

24. The set according to claim 18, wherein each wire in the first multilayer assembly includes: a first part made from semiconductor material having a first doping, the first part being in contact with the growth substrate; a second part made from intrinsic semiconductor material, the second part being disposed on or partly encompassing the first part; a third part made from semiconductor material having a second doping, the third part being disposed on or partly encompassing the second part.

25. The set according to claim 24, wherein a length of at least some of the wires is greater than or equal to a thickness of the dielectric layer and the dielectric layer has a thickness greater than or equal to a thickness of the third part and less than or equal to a height of the wires.

26. The method according to claim 1, wherein the penetrating is performed after the forming of the at least one second electrode.

27. The set according to claim 18, wherein the first electrode is in contact with at least some of the wires and wherein the second electrode is in contact with at least some of the wires.

* * * * *